United States Patent
Evans et al.

(10) Patent No.: US 9,656,601 B2
(45) Date of Patent: May 23, 2017

(54) COATED POLYMERIC SUBSTRATES

(71) Applicants: University of South Australia, Adelaide, South Australia (AU); SMR Patents S.A.R.L., Luxembourg (LU)

(72) Inventors: Drew Raymond Evans, Mawson Lakes (AU); Kamil Zuber, Parafield Gardens (AU); Colin James Hall, Brighton (AU); Simon David Field, Flagstaff Hill (AU); David Derry Chamberlain, New Milton (GB); Andrew Brian Little, Havant (GB); Simon Belcher, South Plymouth (AU); Eugene Schmirin, Broadview (AU); Mark Delaine, Payneham (AU); James Nicholas Dickson, Glen Osmond (AU)

(73) Assignees: SMR Patents S.A.R.L., Luxembourg (LU); University Of South Australia, Adelaide, South Australia (AU)

( * ) Notice: Subject to any disclaimer, the term of this patent is extended or adjusted under 35 U.S.C. 154(b) by 0 days.

(21) Appl. No.: 14/936,024

(22) Filed: Nov. 9, 2015

(65) Prior Publication Data
US 2016/0059773 A1   Mar. 3, 2016

Related U.S. Application Data (63) Continuation-in-part of application No. 14/374,376, filed as application No. PCT/AU2013/000047 on Jan. 24, 2013, now Pat. No. 9,181,616.

(30) Foreign Application Priority Data

Jan. 24, 2012 (AU) .................. 2012900267

(51) Int. Cl.
*B60Q 1/26* (2006.01)
*B60Q 1/34* (2006.01)
(Continued)

(52) U.S. Cl.
CPC ............ *B60Q 1/2665* (2013.01); *B60Q 1/38* (2013.01); *F21S 48/2212* (2013.01);
(Continued)

(58) Field of Classification Search
CPC ..... C23C 14/205; C23C 14/20; C23C 14/228; C23C 14/35; C23C 14/024; C23C 14/025;
(Continued)

(56) References Cited

U.S. PATENT DOCUMENTS

| | | |
|---|---|---|
| 4,101,698 A | 7/1978 | Dunning et al. |
| 5,377,045 A | 12/1994 | Wolfe et al. |

(Continued)

FOREIGN PATENT DOCUMENTS

| | | | |
|---|---|---|---|
| EP | 1305373 B1 | | 9/2008 |
| GB | 1504814 | | 3/1978 |
| WO | WO 2013/110122 | * | 8/2013 |

OTHER PUBLICATIONS

PCT Written Opinion of the International Searching Authority, Application No. PCT/AU2013/000047, dated Feb. 21, 2013.
Takanashi et al., "Antiferromagnetic Exchange Coupling and Magnetoresistance of Fe/Cr Multilayers: Influence of Third Elements in Cr Layers," Journal of the Physical Society of Japan, 1992, vol. 61, No. 11, pp. 4148-4154.

*Primary Examiner* — Michael E La Villa
(74) *Attorney, Agent, or Firm* — MacMillan, Sobanski & Todd, LLC (57) ABSTRACT

The present invention relates to a polymeric substrate being coated with a reflective coating, particularly a chromium-based reflective coating.

31 Claims, 7 Drawing Sheets

(51) Int. Cl.
*F21S 8/10* (2006.01)
*G02B 27/14* (2006.01)
*B60Q 1/38* (2006.01)

(52) U.S. Cl.
CPC .......... *G02B 27/144* (2013.01); *G02B 27/142* (2013.01); *Y10T 428/12* (2015.01); *Y10T 428/12569* (2015.01); *Y10T 428/12847* (2015.01); *Y10T 428/265* (2015.01)

(58) Field of Classification Search
CPC ......... C23C 14/34; C23C 14/14; C23C 14/24; C23C 30/00; C23C 14/0015; C23C 28/02; C23C 28/021; C23C 28/023; C23C 28/00; C22C 28/00; Y10T 428/265; Y10T 428/12; Y10T 428/12569; B32B 15/04; B32B 15/043; B32B 15/08
See application file for complete search history.

(56) References Cited

U.S. PATENT DOCUMENTS

| | | |
|---|---|---|
| 6,416,194 B1 | 7/2002 | Demiryont |
| 6,586,048 B2 | 7/2003 | Welch, Jr. et al. |
| 6,586,098 B1 | 7/2003 | Coulter et al. |
| 6,699,313 B2 | 3/2004 | Coulter et al. |
| 6,906,257 B2 | 6/2005 | Saccomanno et al. |
| 9,181,616 B2 * | 11/2015 | Evans .................. C23C 14/024 |
| 2002/0187350 A1 | 12/2002 | Saccomanno et al. |
| 2003/0134151 A1 | 7/2003 | Usuki et al. |
| 2003/0141096 A1 | 7/2003 | Saccomanno |
| 2003/0207113 A1 | 11/2003 | Coulter et al. |
| 2005/0008848 A1 | 1/2005 | Saccomanno et al. |

* cited by examiner

COATED POLYMERIC SUBSTRATES

CROSS REFERENCE TO RELATED APPLICATIONS

This is a continuation-in-part application of U.S. application Ser. No. 14/374,376, filed under 35 U.S.C. §371 on Jul. 24, 2014, now U.S. Pat. No. 9,181,616; which is the national stage entry of international application PCT/AU2013/000047, filed under the authority of the Patent Cooperation Treaty on Jan. 24, 2013, published; which claims priority to Australian Application Number 2012900267, filed on Jan. 24, 2012. All the aforementioned applications are incorporated by reference herein for all purposes.

FIELD OF THE INVENTION

The present invention relates to a polymeric substrate being coated with a reflective coating, particularly a chromium-based reflective coating. The polymeric substrate may be used in vehicle components, such as rear view devices. The coating is able to provide good abrasion resistance with a neutral colour and is at least in part permeable to light originating from at least one light element.

BACKGROUND OF THE INVENTION

Polymeric materials have many advantages in both commercial and industrial applications compared to traditional materials such as glass. Typically they afford their user design freedom and advantageous properties such as decreased weight and reduced cost of production. An interesting area of application for the surface engineering of polymeric substrates is the design of ultrathin coatings for use in 'everyday' environments, such as easy-clean coatings on smart phones to mirrors and decorative (colourful) coatings in the automotive industry. For example, chrome finishes with custom colours and tints (often with a "brushed-metal" look) are becoming increasing desirable. Such coatings include tinted and deep dark chromes, as well as satin finishes. Furthermore, prolonged exposure to these 'everyday' environmental conditions requires such ultrathin coatings to possess a level of robustness against factors such as acidic or caustic environments, temperature variations from as low as −80° C. to highs of +80° C., variations in relative humidity, as well as abrasive conditions inflicted by everyday wear and tear.

Additionally, in almost all applications employing such coatings, there is a need for the coating to maintain its integrity over extended periods of operation under varying environmental conditions. That is, the coating should not significantly change reflectivity or colour within this time, nor should it delaminate or break away from the underlying substrate.

Further to the above characteristics of permanent and consistent integrity of the coatings, additional properties are desired. For example, in case such coatings are used as coatings for motor vehicle parts, it is desirable that the coatings also provide a certain degree of permeability to light from an natural or artificial light source. This may be suitable for example in case light from a side turn indicator should be visible even through the coating, which otherwise has a decorative effect in masking the light source.

Thus, there is a need for coatings for polymeric substrates that have an improved durability as well as provide characteristics that allow a certain degree of reflectivity and that can be substantially transparent so as to permit hidden lighting functionality if desired. These properties may be particularly useful for applications in motor vehicle components.

The above discussion of background is included to explain the context of the present invention. It is not to be taken as an admission that any of the material referred to was published, known or part of the common general knowledge at the priority date of any one of the claims.

SUMMARY OF THE INVENTION

The present invention relates to a polymeric substrate, wherein the polymeric substrate is coated with a chromium-based reflective coating.

The present invention also provides the chromium-based reflective coating for a polymeric substrate, wherein the coating is an alloy of chromium and a dopant material, the dopant material being selected from the hexagonally close-packed transition metals, the alloy having a crystal structure of a primary body-centered cubic phase in coexistence with a secondary omega hexagonally close-packed phase. In a preferred form of the present invention, the alloy is a binary alloy of chromium and the dopant material.

The present invention also provides a method of forming a chromium-based reflective coating on a polymeric substrate, the method including applying chromium and a dopant material to the polymeric substrate by physical vapour deposition, the dopant material being selected from the hexagonally close-packed transition metals, to form an alloy coating, the alloy coating being applied so as to have a crystal structure of a primary body-centered cubic phase in coexistence with a secondary omega hexagonally close-packed phase. In a preferred form of the present invention, the alloy is applied so as to be a binary alloy of chromium and the dopant material.

In one embodiment of the invention the at least one light element is arranged on one side of the polymeric substrate, and wherein the polymeric substrate and the chromium-based reflective coating are at least in part permeable to light originating from the at least one light element.

The inventive polymeric substrate may be used in different technical fields, such as in automotive industry, advertising industry or any industry which provides products having a protective coating that does also provide light reflective as well as light transmission properties.

The chromium-based reflective coating according to the invention is based on an alloy comprising chromium. Chromium is a Group 6 member of the transition metals and has a body-centered cubic (bcc) crystal structure. Incorporated as the primary component in the preferred binary alloy of the present invention, being an alloy of two principal metallic components, chromium is used primarily for its contribution towards producing a shiny, hard surface that is resistant to corrosion, thus bringing to the alloy the desirable property of optical reflectivity, preferably with an R % greater than 50% so as to find acceptable use in forming a mirror. It has a high melting point, a stable crystalline structure and moderate thermal expansion, making it an ideal primary component for use in the harsh environmental conditions described above.

The secondary component of the preferred binary alloy is the dopant material mentioned above, the dopant material herein often being referred to as M and being selected from the hexagonally close-packed (hcp) transition metals. The hcp structure is the most common among the transition metals, including the transition metals zirconium (Zr), titanium (Ti), cobalt (Co), hafnium (Hf), rubidium (Ru), yttrium (Y), and osmium (Os). In this respect, some of these hcp transition metals, such as Zr, Ti and Co are practically easier materials to work with and so will be preferred dopant materials for the purposes of the present invention.

While it is envisaged that Zr will be the most preferred hcp dopant material, and thus the present invention will be described herein mainly with reference to Zr as the hcp dopant material, this should not be regarded as a limitation on the scope of the present invention.

In a preferred form of the present invention, the alloy will be a binary alloy and the atomic percentage of the dopant material in the binary alloy will be in the range of from about 1.9 at. % to about 5.8 at. %. However, within this broad range, there may be narrower ranges that relate to specific dopant materials, as will be described further below.

It has been found that the introduction of small amounts of a hcp dopant material to the chromium (a bcc transition metal) can yield a range of alloy compositions having an intermetallic crystal structure that has bcc and omega-hcp phases coexisting, which has been found to provide those alloys with further advantageous properties (beyond those of chromium alone). Indeed, it has been found that the careful selection of the amount of hcp dopant material relative to the amount of chromium can give rise to alloy compositions within those ranges that are particularly preferred, where desirable properties (such as abrasion resistance) are maximized and undesirable properties (such as a colour other than a neutral colour) are minimized.

By way of explanation, it has been found that coatings according to the present invention change in phase composition as the elemental composition of the dopant material is increased, from bcc only, to bcc plus omega-hcp, to bcc plus an amorphous phase. The optical and mechanical properties observed for the coatings show variation commensurate with these changes in composition, with the preferred optical and mechanical properties occurring when the phase composition is bcc plus omega-hcp. Without wishing to be bound by theory, it is believed that the observed changes are due to the changing electron structure of the atoms and the crystallographic conformation relative to each other.

Specifically, when the phase composition was bcc plus omega-hcp, the crystal structure of the coatings demonstrated d-orbital transitions which gave rise to neutral colour and relatively lower reflectivity, with the well-ordered crystal structure yielding higher relative resistance to abrasion. By way of comparison, when the amorphous phase was present, the d-orbital transitions were no longer observed, indicating that the orbital hybridization between neighbouring atoms was partially filling the d-orbitals, correlating with a less-preferred lower reflectivity. Furthermore, the lower atomic packing density in such an amorphous phase was found to yield coatings with reduced resistance to abrasion, which of course is also less desirable.

With this in mind, and referring to the dopant material as M in the general formula $CrM_x$, this transition of phase from bcc plus omega-hcp, to bcc plus an amorphous phase, was found to occur at values of x of about 0.06, correlating to about 5.8 at. %, when the dopant material was Zr. The same transition is expected to occur at about the same value of x also for Ti and Co.

Unlike the reflectivity, the colour of the coatings of the present invention was found to not show a change in trend at the transition of the phase from bcc plus omega-hcp, to bcc plus an amorphous phase. To the contrary, at the transition of the phase from bcc to bcc plus omega-hcp, which was found to occur for Zr at values of x (in the above general formula) of about 0.05 (correlating to a lower limit of about 4.5 at. %), a transition in the colour of the coatings of the present invention was found. This suggests the onset of the orbital hybridization in the electron structure occurs at concentrations of Zr as the dopant material close to about 4.5 at. %. However, the same transition point for Co as the dopant material was found to be about 1.9 at. %.

By way of explanation, and again using Zr as the exemplary hcp dopant material, at low concentrations there is an increase in the resistance to abrasion upon increasing the elemental composition of Zr. A maximum in the resistance to abrasion is observed at the transition from bcc to the bcc plus omega-hcp, after which increasing the Zr concentration leads to a steady decrease in the measured abrasion ratio. Indeed, from an electron diffraction analysis of $CrZr_x$ coatings, two transition concentrations are defined that represent the change from one phase composition to another. For Zr as the dopant material, these transitions are at about x=0.05 (bcc to bcc+Ω-hcp) and about 0.06 (bcc+Ω-hcp to bcc+ amorphous). In this respect, the omega-hcp phase is understood to be a displacive phase transformation from the bcc structure.

Accordingly, in one form of the present invention, the alloy will be a binary alloy and the dopant material will be Zr, wherein the atomic percentage of the dopant material in the binary alloy will be in the range of from about 4.5 at. % to about 5.8 at. %.

In yet another form of the present invention, the alloy will be a binary alloy and the dopant material will be Co, wherein the atomic percentage of the dopant material in the binary alloy will be in the range of from about 1.9 at. % to about 5.7 at. %. In relation to predictive conclusions able to be drawn by the inventors (based on the similarity in the physical nature of all hcp transition metals) from the experimental work (described below) conducted in relation to Zr and Co, and to an extent Ti, it will be appreciated by a skilled addressee that the behaviour of the other hcp transition metals as the dopant material in the present invention can be reasonably expected to be the same or similar to that as seen with Zr, Co and Ti. Indeed, the comparative experimental work conducted (again, see below) on the bcc transition metal molybdenum (Mo), where similar behavior was not expected (and was not seen) due to the different physical nature of this transition metal, also tends to confirm these predictive conclusions about the hcp transition metals.

Indeed, given that the physical nature of the other hcp transition metals is similar to both Zr and Co, it is expected that Ti, Hf, Ru, Y and Os will display the same structure forming abilities in the Cr based alloy of the present invention when their concentration is within the range of about 1.9 at. % to about 5.8 at. %.

The coatings of the present invention are preferably ultrathin coatings, wherein the thickness is selected to achieve the desired optical property, such as transmission and/or reflectivity. For example, the coating is being defined in this specification to be a coating with a thickness of 200 nm or less. In one embodiment, the coating has a thickness of 100 nm. It is envisaged that preferred thicknesses will be in the range of 100 nm or less, or more preferably in the range of 40 nm to 80 nm, or more preferably in the narrower range of 50 nm to 70 nm. Ideally, the thickness will be about 60 nm.

Preferably, the inventive polymeric substrate is formed by injection compression moulding, although any other method known in the art, such as compression moulding, blow moulding, reaction moulding and sheet casting, could also be utilised and thus also falls within the scope of the present invention.

The polymeric substrate may be any known type of polymeric substrate material and for example could be a substrate formed from a material selected from the group including polyacrylate, polyester, polystyrene, polyethylene, polypropylene, polyamides, polyamides, polycarbonate, epoxy, phenolic, acrylonitrile-butadiene-styrene, acrylonitrile-styrene-arylates, acetal and blends of these. Preferred substrate materials include polycarbonate, poly(2,2'-dihydroxyphenylpropane) carbonate, polydiethyleneglycol bis (allyl carbonate), polymethylmethacrylate and polystyrene, or blends thereof.

The polymeric substrate bearing the coating of the present invention may also include other coatings (pre-coatings) either between the coating and the substrate, within the coating, or as an outer layer. In particular, it is envisaged that in some embodiments it will be advantageous to include a hardcoating between the coating and the substrate or as an outer coating. In this form, the hardcoating is a protective layer which does not contribute to the overall desired optical effect, while in other embodiments an external protective layer upon the decorative coating will itself be a hardcoating.

In this respect, a coating that is said to be a "hardcoating" is a coating that is harder and stiffer than the substrate, whereby it increases the abrasion resistance of that substrate. Examples for hardcoats are, but not limited to, organo-silicon, an acrylic, a urethane, a melamine or an amorphous $SiO_xC_yH_z$. Such an abrasion resistant hard coating is one that reduces damage due to impacts and scratching. Abrasion resistance can be measured through tests such as ASTM F735 "Standard Test Method for Abrasion Resistance of Transparent Plastics and Coatings Using the Oscillating Sand Method", ASTM 04060 "Standard Test Method for Abrasion Resistance of Organic Coatings", by the Taber Abrader, or by using the well-known Steelwool Test.

The abrasion resistant layers are preferably formed from one or more materials selected from the group consisting of an organo-silicon, an acrylic, a urethane, a melamine or an amorphous SiOxCyHz. Most preferably, the abrasion resistant layer is an organo-silicon layer, due to its superior abrasion resistance and compatibility with physical vapour deposited films. For example, an abrasion resistant layer comprising an organo-silicon polymer can be formed by forming a layer of a compound selected from the following compounds by a method such as dip coating or the like and then curing the layer: trialkoxysilanes or triacyloxysilanes such as methyltrimethoxysilane, methyltriethoxysilane, methyltrimethoxyethoxysilane, methyltriacetoxysilane, methyltripropoxysilane, methyltributoxysilane, ethyltrimethoxysilane, ethyltriethoxysilane, vinyltrimethoxysilane, vinyltriethoxysilane, vinyltracetoxysilane, vinyltrimethoxyethoxysilane, phenyltrimethoxysilane, phenyltriethoxysilane, phenyltriacetoxysilane, gamma-chloropropyltrimethoxysilane, gamma-chloropropyltriethoxysilane, gamma-chloropropyltripropoxysilane, 3,3,3-trifluoropropyltrimethoxysilane gamma-glycidoxypropyltrimethoxysilane, gammaglycidoxypropyltriethoxysilane, gamma-(beta-glycidoxyethoxy)propyltrimethoxysilane, beta-(3,4-epoxycyclohexyl)ethyltrimethoxysilane, beta-(3,4-epoxycyclohexyl)ethyltriethoxysilane, gamma-methacryloxypropyltrimethyoxysilane, gamma-aminopropyltrimethoxysilane, gamma-aminopropyltriethoxysilane, gammameraptopropyltrimethoxysilane, gamma-mercaptopropyltriethoxysilane, Nbeta(aminoethyl)-gamma-aminopropyltrimethoxysilane, betacyanoethyltriethoxysilane and the like; as well as dialkoxysilanes or diacyloxysilanes such as dimethyldimethoxysilane, phenylmethyldimethoxysilane, dimethyldiethoxysilane, phenylmethyldiethoxysilane, gammaglycidoxypropylmethyldimethoxysilane, gammaglycidoxypropylmethyldiethoxysilane, gamma-glycidoxypropylphenyldimethoxysilane, gammaglycidoxypropylphenyldiethoxysilane, gamma-chloropropylmethyldimethoxysilane, gamma-chloropropylmethyldiethoxysilane, dimethyldiacetoxysilane, gammamethacryloxypropylmethyldimethoxysilane, gammametacryloxypropylmethyldiethoxysilane, gammamercaptopropylmethyldimethoxysilane, gamma-mercaptopropylmethyldiethoxysilane, gamma-aminopropylmethyldimethoxysilane, gammaaminopropylmethyldiethoxysilane, methylvinyldimethoxysilane, methylvinyldiethoxysilane and the like.

The pre-coated films may also include, inorganic oxides (silica, titania, alumina), thin metal films (Cr, etc), where the pre-coated substrate has been prepared to have the desirable surface energy, residual stress, thermal coefficient of expansion, conductivity, chemical functionality, etc, as required by the specific application of such a Cr based alloy coating.

In a similar manner, a skilled addressee will understand that an overcoating may be applied over the coating of the present invention, which overcoating could include transparent coatings for the purposes of mechanical strength, wettability, optical interference filters, modified coefficient of friction, etc. The overcoating may be the above hardcoating or any other protective layer. Such protective layer(s) provide enhanced abrasion resistance, fingerprint resistance and 'easy clean' functionality. Suitable materials for such a protective layer could be plasma polymerised hexamethyldisiloxane (HMDSO), fluoro polymer based coatings deposited via evaporation or liquid transfer techniques, or a liquid hardcoat applied via spin, dip, spray or flow coating techniques, with or without particulate additives for haze control (matt additive). In one embodiment, in case the polymeric substrate is used as a housing of a rear view device, the overcoating is permeable to light from the light element and may have the same colour as the rest of the rear view device and the vehicle. In one embodiment the colour may be different to the rest of the vehicle.

In a preferred form, the physical vapour deposition techniques adopted in the method of the present invention will be based upon magnetron sputtering, be it from a primary alloy target or using a co-sputtering process involving two targets made from the respective components of the alloy. Alternatively, it will be appreciated that the preferred alloy could be deposited using thermal evaporation or e-beam evaporation of the respective alloy components.

Before turning to a description of various preferred embodiments of the present invention, it will be appreciated that, due to the nature of polymeric substrates, conventional temperature processing (during or after deposition) could generally not be employed to modify the properties of alloy coatings of the type of the present invention, although this finally depends on the polymeric material of the polymeric substrate. In the inventive coatings, the inventors have determined that the preferred alloys change in phase composition as the elemental composition of a dopant material (such as Zr, Ti or Co) is increased; from bcc only, to bcc plus Ω-hcp, to bcc plus an amorphous phase. The optical and mechanical properties for these preferred alloys (as ultrathin coatings) show variation commensurate with the composition and observed changes relate to the changing electron structure of the atoms and the crystallographic conformation relative to each other.

Indeed, these crystalline ultrathin coatings demonstrate d-orbital transitions that give rise to neutral colour and relatively lower reflectivity, with a well ordered crystal structure yielding higher relative resistance to abrasion. When amorphous material is present in the coatings, the d-orbital transitions are no longer observed, indicating the partial filling of the d-orbitals. It is believed that the orbital hybridization between neighbouring atoms partially fills the d-orbitals, correlating with a yellow colour and higher reflectivity. Furthermore, the lower atomic packing density in the amorphous phase yielded coatings with reduced resistance to abrasion.

DESCRIPTION OF THE PREFERRED EMBODIMENTS

The present invention will now be described in relation to various preferred embodiments of which some aspects are illustrated by the accompanying figures, with other aspects being illustrated by the following examples as summarised in the following tables. In the figures.

As stated above, the present invention is directed to a polymeric substrate, wherein the polymeric substrate is coated with a chromium-based reflective coating. The polymeric substrate and the chromic-based reflective coating are at least in part permeable to light originating from at least one light element.

In one embodiment of the present invention, a vehicle component such as a rear view device could comprise the polymeric substrate coated with the chromium-based reflective coating. The at least one light element could be any light source suitable for this purpose. In one embodiment the at least one light element is a LED lamp and could be arranged directly on the substrate. For example, this could be done by any means suitable for attaching the light element to the polymeric substrate, such as adhesives, screws, by welding or the like. Alternatively, the light source could be arranged close to the substrate, i.e. in the proximity of the substrate. For example, the light source could be arranged on the inside of a housing of a rear view device comprising the polymeric substrate and light originating from the LED lamp could shine through the polymeric substrate and through the chromium-based reflective coating. Advantageously, a component of a vehicle, or at least part of the component can serve as an ambient light source.

In one embodiment of the present invention the polymeric substrate is comprised by a housing for a side turn indicator of a rear view device of a vehicle with the side turn indicator comprising at least one light element.

The polymeric housing could be part of a housing of a rear view device of a vehicle, preferably of a motor vehicle, such as a car, a bus, a van, a motorcycle or the like. However the polymeric housing could also accommodate the back view element of the rear view device as well as the required components to move the back view element. The back view element could be for example a mirror made of glass, or a visual mirror comprising an electronic display. The polymeric housing could be arranged so that it is orientated towards the driving direction of the car to signal the drivers intention to change direction to the oncoming traffic.

The polymeric housing also comprises at least one first side turn indicator. Generally, the at least one first side turn indicator may have any possible form and may be positioned in any direction which is desired due to technical reasons, design reasons or legal reasons. For example, the at least one first side turn indicator could be substantially elongated and could be arranged in the polymeric housing so that it is aligned substantially parallel to the street. Here, the term "substantially parallel" defines that the side turn indicator is arranged in the housing so that it is orientated horizontally to the driving direction. The polymeric housing could also comprise more than just one side turn indicator, such as two side turn indicators, three side turn indicators or even more. For example, the polymeric housing could comprise a second side turn indicator that points away from the driving direction so that the on and off states of the driving indicator are also signalized to the driver of the vehicle.

In one embodiment of the invention the at least one light element in the form of a side turn indicator is incorporated into the polymeric housing by over-moulding the side turn indicator with the polymeric material of the housing. Here, the terms over-moulding and co-moulding can be used interchangeably to refer to the incorporation of at least part of the side turn indicator into the polymeric material of the polymeric housing. Advantageously, the side-turn indicator can be fully sealed in the polymeric housing so that it is not visible from the outside of the polymeric housing. However, when the indicator is activated, light originating from the side-turn indicator can shine through the polymeric housing (i.e. the polymeric substrate and the chromium-based reflective coating) to signalize the drivers intention to change direction. Here, the term "shine through" can be used to define that the material of the polymeric housing is at least in part permeable to light. Therefore, the side-turn indicator can be located closely beneath the material surface. This way of integrating the side turn indicator is especially suitable when space constraints and exterior surface constraints need to be observed.

In another embodiment of the invention, the side turn indicator is incorporated into an opening in the surface of the polymeric housing that is closeable with a lid comprising the same material than the polymeric housing and being coated with the chromium-based reflective coating. Instead of overmolding the side turn indicator, the side turn indicator can also be integrated in an opening in the polymeric housing. Here, the side turn indicator can be connected to the polymeric material by means of screws, welding, and/or by means of an adhesive. The opening can then be closed by the lid comprising the same material than the polymeric housing and being coated with the chromium-based reflective coating, so that light originating from the side turn indicator can shine through the lid.

In one embodiment of the invention, the side turn indicator comprises a polymeric light pipe, preferably a light pipe comprising a clear polymeric material. The clear polymeric material may be selected from the group consisting of polyacrylate, such as poly(methyl methacrylate) (PMMA), polyester, polystyrene, polyethylene, polypropylene, polyamides, polyamides, polycarbonate, epoxy, phenolic, acrylonitrile-butadiene-styrene, acrylonitrile-styrene-arylates, acetal and blends of these. Preferred substrate materials include polycarbonate, poly(2,2'-dihydroxyphenylpropane) carbonate, polydiethyleneglycol bis(allyl carbonate), polymethylmethacrylate and polystyrene, or blends thereof. In one embodiment the light pipe is made from PMMA. Here, the term "light pipe" can be used to refer to a tubular structure that is adapted to transport light. Light might be coupled into the light pipe at one, or at both ends of the light pipe. The light is then being radiated from the light tube along its length, or at least along part of its length. The light pipe could also comprise reflecting elements so that light is directed into the driving direction of the vehicle. Here, in this example, the light pipe could be over-molded by the polymeric material of the housing. Also, the interior and/or exterior surface of the light pipe could comprise at least in part an optic pattern. By employing such a pattern, certain illumination effects can be advantageously achieved.

The light source may be any suitable light source applicable for the intended purpose. In one embodiment of the invention, the polymeric light pipe comprises at least one LED lamp to illuminate the light pipe. Here, the at least one LED lamp could be arranged at one end of the light pipe, to radiate light into the light pipe. The light is then radiated away from the light pipe along the length of the light pipe as described above. Preferably, two LED lamps are employed, where at each end of the light pipe one LED lamp is located. The LED lamps could be arranged in the polymeric housing so that they are easily accessible from the inside of the polymeric housing. Advantageously, the at least one LED lamp can be easily replaced in such a arrangement.

In one embodiment of the invention, the at least one polymeric light pipe is adapted to sequentially radiate the light from the at least one LED lamp. In the description the term "sequentially" can be used to refer to a light sweep effect. For example, light might sweep from the centre of the vehicle outwards to promote direction of travel, where the light has the appearance of a continuous even illumination. Therefore, the polymeric light pipe could comprise reflecting and/or diffusing elements for creating the light sweep effect.

One embodiment of the invention relates to a rear view device of a vehicle comprising a polymeric substrate according to the invention. In one specific embodiment of the invention the rear view device comprises a surface having a metallic appearance that is realized by the coated polymeric substrate. In one specific embodiment of the invention a side turn indicator is arranged below the surface having a metallic appearance or comprises at least part of said surface having the metallic appearance. In one specific embodiment of the invention light originating from a light source of the side turn indicator shines through the surface of the polymeric substrate having a metallic appearance. In one specific embodiment of the invention light originating from the light source of the side turn indicator sweeps in one direction, like from a center outwards, to indicate a direction of travel. In one specific embodiment of the invention the light front is moving in said direction.

Figure 7:
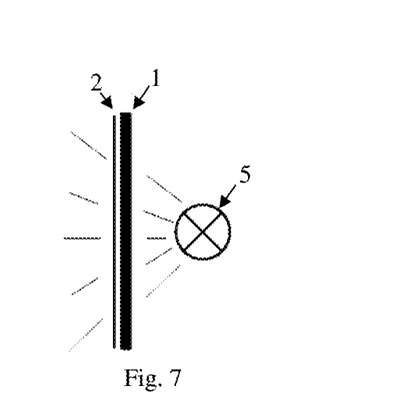
FIG. 7 shows a schematic view of a polymeric housing according to an example of the invention, and a LED lamp.

FIG. 7 shows a schematic view of a polymeric housing 1 according to an example of the invention, and a LED lamp 5. In the shown example, the LED lamp 5 is arranged on one side of the polymeric housing 1. The indicated light rays show that light originating from the LED lamp 5 can shine through the polymeric material of the housing 1 and through the chromium-based reflective coating 2 that is arranged on the polymeric housing 1.

Figure 8A:
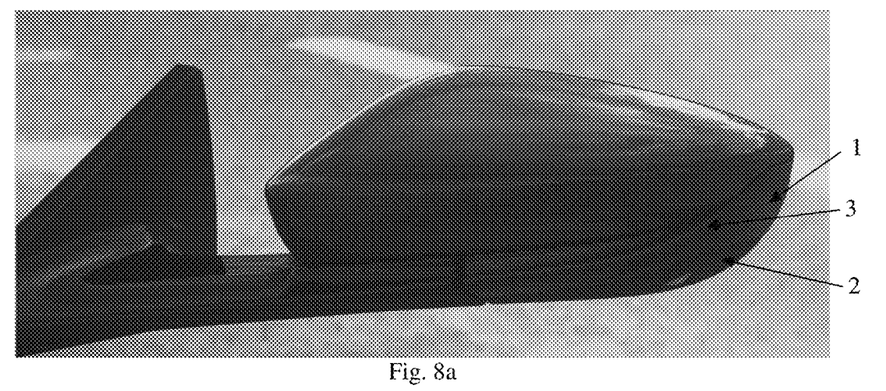
FIGS. 8a, 8b show schematic views of the polymeric housing for a side turn indicator being part of a housing of a rear view device of a vehicle according to an example of the invention with the side turn indicator activated and deactivated.
Figure 8B:
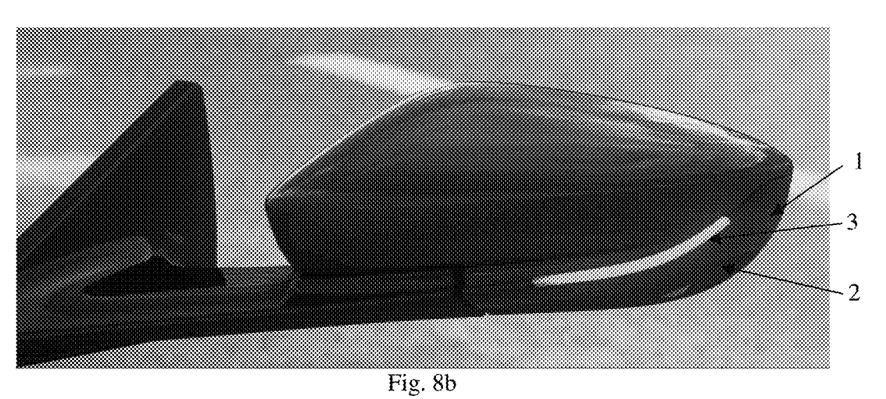

In FIGS. 8a and 8b schematic views of the polymeric housing 1 for a side turn indicator 3 are shown. In the shown example the polymeric housing 1 is part of a housing of a rear view device of a vehicle. In FIG. 8a, the side turn indicator 3 is shown in the deactivated state. Therefore, by merely looking at the outside of the polymeric housing 1 no indication is given that a side turn indicator 3 is arranged at the inside the polymeric housing 1. FIG. 8b shows the side turn indicator 3 in the activated state, where light originating from the side-turn indicator 3 shines through the polymeric housing 1 and through the chromium-based reflective coating 2 to signalize the drivers intention to change direction.

In FIGS. 8a and 8b the polymeric housing 1 and the rear view device housing are shown as separate components. However, the skilled person would know that the polymeric housing 1 of the side turn indicator 3 could also accommodate the back view element of the rear view device.

Figure 9A:
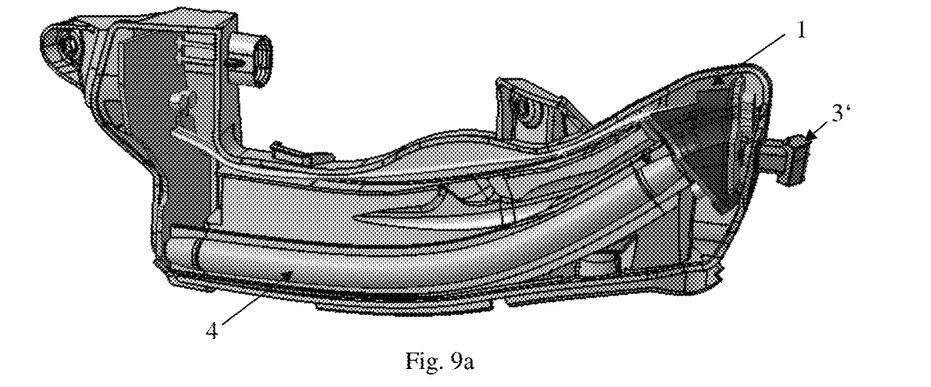
FIGS. 9a, 9b, 9c show schematic views of the polymeric housing and a polymeric light pipe according to an example of the invention.
Figure 9B:
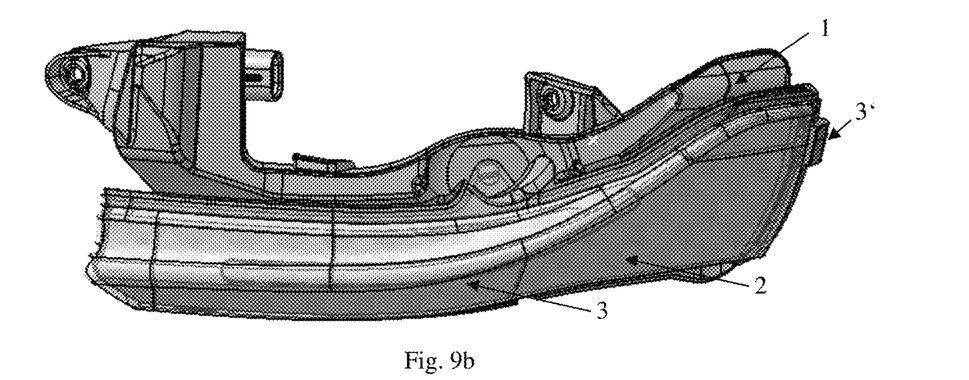
Figure 9C:
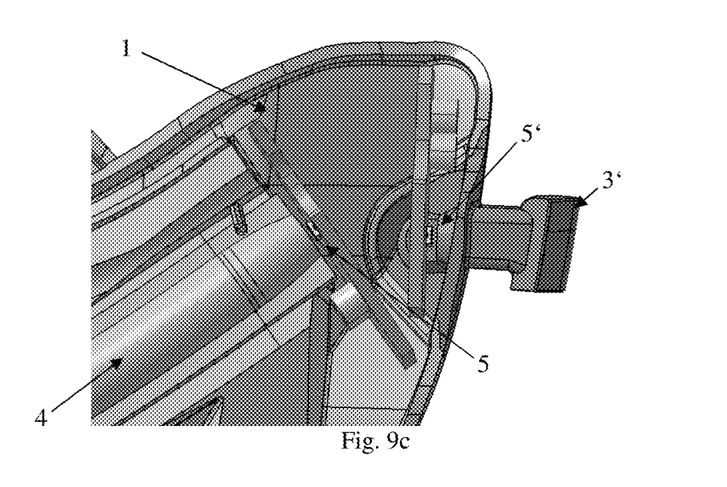

FIGS. 9a, 9b, 9c show schematic views of the polymeric housing 1 and a polymeric light pipe 4 according to an example of the invention. In FIG. 9a the polymeric light pipe 4 is shown, the light pipe 4 has a tubular structure and is located essentially horizontally in the polymeric housing 1. In the shown example, light is coupled into the light pipe 4 by means of at least one LED lamp 5. In FIGS. 9a, 9b, 9c a second side turn indicator 3' is shown that also uses at least one LED lamp 5' and points away from the driving direction into the opposite direction of the vehicle. FIG. 9b shows the polymeric light pipe 4 being over-molded by the polymeric material of the polymeric housing 1.

In another example, the at least one side turn indicator comprises a plurality of LED lamps and a light reflector arrangement, wherein the plurality of LED lamps are adapted to sequentially illuminate the light reflector element. The plurality of LED lamps could be densely arranged along the entire length of the side turn indicator, e.g. one after another. A reflector arrangement could be arranged so that the light radiated from the LED lamps is reflected into the driving direction of the vehicle. Each LED of the plurality of LED lamps could be triggered by a microcontroller with enough outputs to drive each LED lamp individually. In this manner all LED lamps can be switched on at the same point of time, or shortly after another so as to create the sweep appearance. Alternatively, the plurality of LED lamps could be also triggered by shift register components which are driven by a single output of a microcontroller. The microcontroller could be also logically linked with the vehicle front turn signal, such that if the front turn signal is not operational then the plurality of LED lamps in the at least one side turn indicator are not triggered.

In another example, the at least one side turn indicator comprises a plurality of LED lamps and a light diffusing element, wherein the plurality of LED lamps are adapted to sequentially illuminate the light diffusing element. Advantageously, all LED lamps from the plurality of LED lamps can illuminate a common diffusing element from one edge, allowing a level of overlap in output to give a smoother sweep appearance. As described above, the plurality of LED lamps can be triggered by a microcontroller having a sufficient amount of outputs and/or by shift register components which are driven by a single output of the microcontroller.

Figure 10:
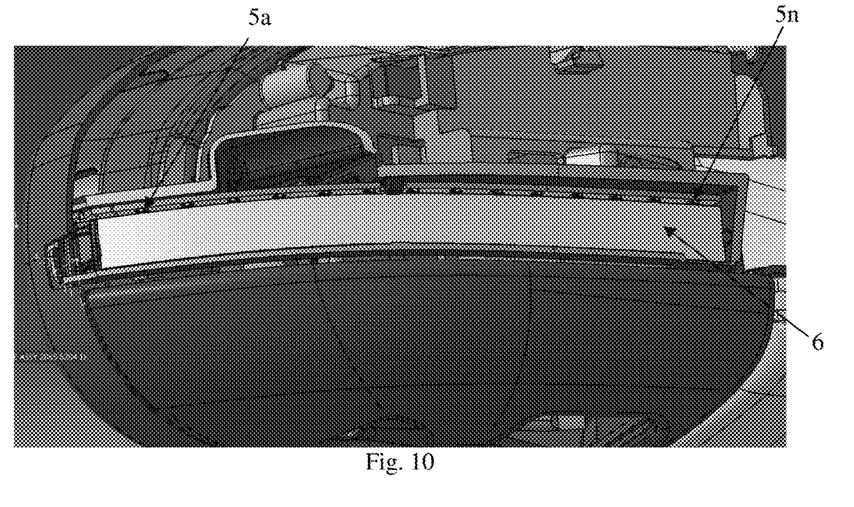
FIG. 10 shows a schematic view of a housing comprising a side turn indicator having a plurality of LEDs and a light diffusing element according to an example of the invention.

FIG. 10 shows a schematic view of a housing comprising a side turn indicator having a plurality of LED lamps $5a, \ldots, 5n$ and a light diffusing element 6 according to an example of the invention. In the shown example, the side turn indicator comprises 14 LED lamps $5a, \ldots, 5n$ that are all arranged horizontally in a single row and separated from each other by an equal distance. Arranged below is a light diffusing element 6 that is shown to be slightly tilted and which is illuminated from the LED lamps $5a, \ldots, 5n$ on one of its edges, allowing a level of overlap in output to provide a smoother sweep appearance.

Examples

Physical Properties of the Coating

Experiments were conducted to form various coatings in accordance with the present invention upon polymeric substrates. In these experiments, specially prepared polymeric substrates were utilised, which themselves included coatings applied directly thereupon. Indeed, the polymeric substrates were a polycarbonate material (approximately 8 cm×8 cm squares of 0.5 cm thickness) coated with a hardcoat resin (PHC587B from Momentive Performance Materials Inc., TSR2626B from SDC Technologies Inc., or PR660/MP101 from SDC Technologies Inc.), the hardcoat then itself coated with a reactively sputtered $SiO_2$ layer.

The polymeric substrate was dip-coated at a withdrawal speed of 11 mm/s, or spin-coated at 300 revolutions per minute (rpm) for 5 seconds, and cured as per the manufacturers prescribed conditions, to thereby form the hardcoat resin layer upon the polymeric substrate. For the $SiO_2$ layer, a custom-built reactor was used to sputter a high purity Si target in an $Ar+O_2$ environment. The hardcoat resin layer and the $SiO_2$ layer had thicknesses of 5 µm and 140 nm respectively, as determined using a F20 Thin Film Analyzer by Filmetrics Inc.

The chromium-based reflective coating of the present invention was subsequently applied to the specially prepared polymeric substrates in a custom-built reactor by magnetron co-sputtering a $CrM_x$ alloy layer (where M=the hcp transition metals Zr and Co), to form a range of exemplified samples. In addition, comparative samples were prepared where M=the bcc transition metal molybdenum (Mo).

The substrates were heated to 85° C. using an infrared lamp in the custom-built reactor as the chamber was evacuated to approximately $1\times10^{-4}$ mbar. A co-sputtering process employing two sputter targets was used to deposit the $CrM_x$ alloy layer. The substrate holder was rotated at 60 rpm through the respective plasma's generated from a 5"×12" rectangular high purity Cr target and a 3" disc dopant material target. A sample rotation speed of 60 rpm was chosen because each pass through the plasma was calculated to deposit approximately 4 to 6 Angstrom of combined material from the targets, thus avoiding a sandwich type layer structure and achieving the preferred binary alloy coating.

A working gas of Ar was introduced at flow rates of 80 standard cubic centimeters per minute (seem). For deposition, the Cr target was set at a constant power of 1 kW, while the dopant material target was set within the range of 25 to 100 W to define the experimental window for neutral coloured abrasion resistant alloy coatings. The final reflective coating for the samples had a $CrM_x$ film thickness in the order of 40 to 60 nm as determined by Atomic Force Microscopy imaging. The Cr:M ratios within the coatings of the samples were generated by changing the dopant material (M) deposition rate relative to the Cr, with the actual ratios achieved determined using X-ray Photoelectron Spectroscopy (XPS) analysis (Kratos Axis Ultra DLD with an Al-Kα monochromatic source).

Figure 1:
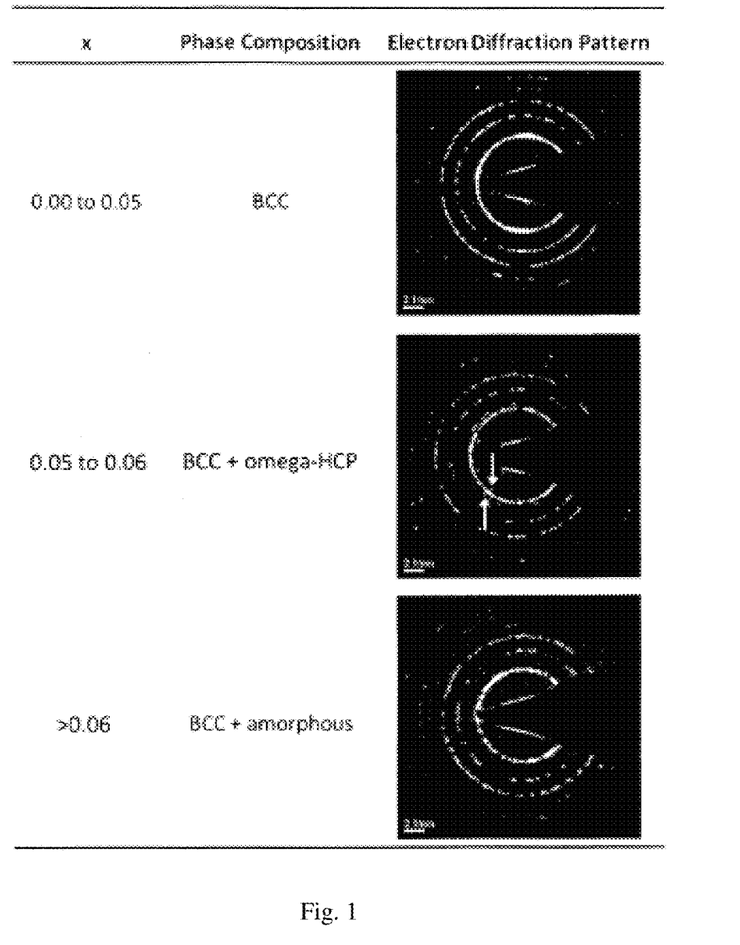
FIG. 1 shows the phase composition of a $CrZr_x$ coating as a function of its elemental composition—the presence of the $\Omega$-hcp is represented by the diffraction highlighted with the arrows.

The elemental composition, defined by x, of the ultrathin $CrM_x$ films was determined for each of the samples—see Table 1 (for Zr) and Table 2 (for Co) below for the collected data. With Zr used as the dopant material M, as the ratio between the power density applied to the Zr and Cr targets increased, there was a near linear increase in the Zr concentration in the ultrathin film. For each of the Zr samples the electron diffraction pattern was collected using TEM (see FIG. 1), and then analysed with respect to the major constituents within the film. The spot size of the electron beam was minimised to produce the clearest diffraction patterns possible for these polycrystalline ultrathin films (polycrystalline with respect to the small grain-like/columnar structures that constitute the film).

From the electron diffraction analysis of the $CrZr_x$ films, two transition concentrations are defined that represent the change from one phase composition to another. These transitions are at x=0.05 (bcc to bcc+Ω-hcp) and 0.06 (bcc+Ω-hcp to bcc+amorphous). The Ω-hcp phase is a displacive phase transformation from the bcc structure.

Figure 2:
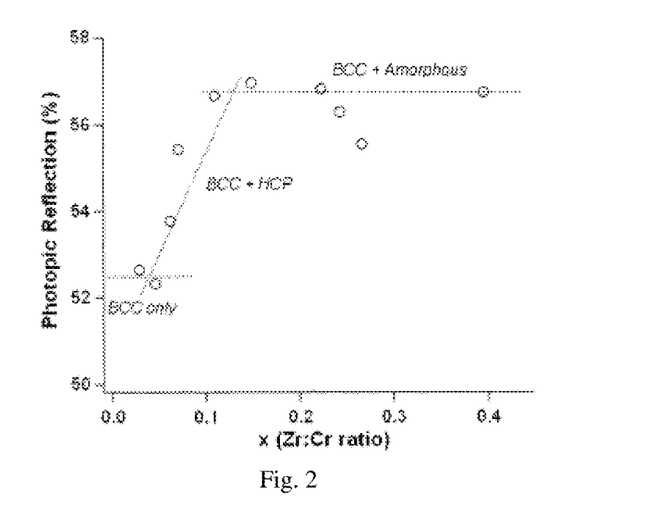
FIG. 2 shows the photopic reflectivity of a $CrZr_x$ coating as a function of the elemental composition—the optical reflectivity of the coating follows its phase composition.

The optical properties of each sample were determined using a HunterLab UltraScan Pro instrument. These optical measurements were quantified by the CIELAB colour model. A "neutral" colour is reference to a colour that is defined by measured L*, a* and b* values in accordance with the 1976 CIE L*a*b* Space (or CIELAB) colour model, which is an approximately uniform colour scale organised in cube form. In the orthogonal a* and b* colour axes, positive a* values are red, negative a* values are green, positive b* values are yellow and negative b* values are blue, while the vertical scale for lightness (or greyscale) L* runs from 0 (black) to 100 (white), allowing the positioning of a total colour E in three points. The Chroma (C*) of the colour is defined as $\sqrt{(a^{*2}+b^{*2})}$, and is used to quantify the magnitude of the colour independent of its lightness. Ideally, for the colour E to be neutral, the C* value will be less than or equal to 1 and the colour E will thus be close to the neutral L* axis. Here, it is quantified by measures of a* and b* (as mentioned above) which embody the colour or chroma ($C^*=\sqrt{(a^{*2}+b^{*2})}$) of the captured light, be it transmitted or reflected. Also, the total photopic reflectivity (R %) of the coatings was measured. With reference to Tables 1 and 2 and FIG. 2, the reflectivity was observed to change over the elemental composition range presented. More so, the optical response followed that of the phase composition of the film with observed discontinuities in the reflectivity versus elemental composition at the transition concentrations defined from the electron diffraction assignment.

Further to this change in reflectivity, at lower concentrations of Zr a maxima and minima was observed in the reflectivity as a function of photon energy. Indeed, measurement of the photon energy for the maxima and minima yielded 2.5 and 2.2 eV respectively, at concentrations up to $CrZr_x=0.11$. At these energy levels the observed maxima is assigned to electron transitions from the filled d-orbital bands to the empty d-orbital bands of the atoms, namely the $3 \rightarrow 5$ transition.

From the electron diffraction images, the crystal structure in this concentration range was representative of the bcc structure for Cr.

The loss of the maxima and minima in the reflectivity correlates with the transition from the purely crystalline alloy films (bcc and bcc+Ω-hcp) to the crystalline plus amorphous. It is believed that in the amorphous phase the higher concentration of Zr yielded partially filled d-orbital bands of the $CrZr_x$ structure through orbital hybridization. Increased filling of the orbitals removed the d-orbital interband transitions because they were then occupied. The electron transitions that occurred in the electronic structure of the atoms then occurred at energies outside of the visible spectrum (>3.5 eV). As the d-orbital transitions were reduced and eliminated by increasing the Zr concentration, the yellow part of the visible spectrum (ca 2.15 eV) increased in reflectivity relative to the other energy regions. Thus, the samples changed in their colour intensity (chroma) from neutral to yellow when the elemental composition of Zr increased, as is apparent from FIG. 3.

Figure 3:
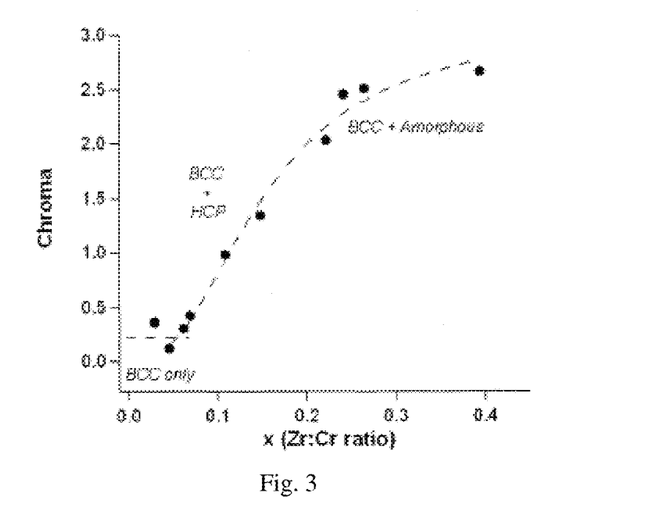
FIG. 3 shows the reflected chroma of the thin film coating as a function of the elemental composition of a $CrZr_x$ coating—chroma embodies the magnitude of the colour relative to neutral, but not the specific colour observed; the transitions between phases are not likely to be discrete at a given concentration.

Indeed, unlike the reflectivity, the chroma of the ultrathin film did not show a change in trend at the transition concentration between crystalline to crystalline plus amorphous—see FIG. 3. At the transition concentration (x=0.05) where the additional Ω-hcp is observed, there is a transition in the C* value of the ultrathin films. This suggests the onset of the orbital hybridization in the electron structure occurs at concentrations of Zr close to x=0.05.

The abrasion resistance of the reflective coating of each sample was determined by employing the Bayer abrasion test. This test is employed in a variety of different industries to qualify the abrasion resistance of a coating, with the variant employed here being similar to the ASTM F735 standard for the determination of abrasion resistance of aircraft windows and ophthalmic lenses. A Taber Oscillating Abrasion Tester (model 6100) was used to subject the samples to 300 cycles (150 cycles/min) over a stroke length of 100 mm under an applied load of 0.5 kg of Alundum chips (Norton Company of Worcester Mass., USA). In this test, the abrasion resistance is quantified by the Bayer Ratio that takes account of the change in haze (or reflection haze for reflective substrates) of the sample from the abrasion, normalised against the change in haze observed for a reference sample (as per SAE J964). Haze is determined by:

Haze=$(R \%_{SE}/R \% si) \times 100$, where $R \%_{SE}$ and $R \%_{SI}$ are the reflectivity with the specular beam excluded and included respectively.

Both the sample and the reference were tested for haze using the same HunterLab UltraScan Pro instrument used for the colour and reflectivity measurements. In this study, the same type of reference material was used for determination of the Bayer Ratio (a piece of uncoated polycarbonate). The larger the determined Bayer Ratio, the greater the abrasion resistance relative to the reference sample. To reference the performance of the coating of the present invention, in situations where various pre-coating films were present as a part of the polymeric substrate, the abrasion resistance is compared to the Bayer Ratio for a chrome nitride (CrN) coating using the same pre-coated substrate, where the abrasion resistance of the CrN coating is defined as the acceptable level of abrasion resistance, and the acceptable level of abrasion resistance for embodiments of the present invention are then represented as an abrasion resistance (%) of 100%.

Again with particular reference to the samples having Zr as the dopant material M, the mechanical properties of the ultrathin $CrZr_x$ films were characterised by measurement of abrasion resistance. Importantly, it was recognised that the resistance to abrasion is not solely characterised by a Cr:Zr ratio, but also by the underlying layers in a multilayer structure. Therefore, in this experimental work, the specially prepared substrates were constant within a given sample, and hence relative variations in the mechanical properties could be assigned to changes in the ultrathin $CrZr_x$ coatings.

Figure 4:
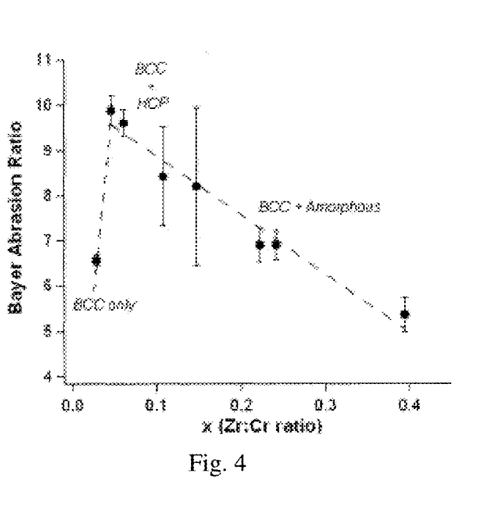
FIG. 4 shows the abrasion resistance of a $CrZr_x$ coating as a function of the elemental composition of the $CrZr_x$ coating.

The abrasion ratio determined by the Bayer abrasion test mentioned above is shown in Table 1 and FIGS. 4 and 6 for Zr as the dopant material, and in Table 2 and FIG. 6 for Co as the dopant material. For the purposes of comparative analysis the bcc transition metal Mo was used as the dopant.

Table 1 shows that there was an increase in the resistance to abrasion upon increasing the elemental composition of Zr. A maximum in the resistance to abrasion was observed immediately after the transition from bcc to the bcc+Ω-hcp, after which increasing the Zr concentration lead to a steady decrease in the measured abrasion ratio. Table 2 shows that the resistance to abrasion increased in line with the increase in elemental composition of Co, with the maximum abrasion resistance achieved prior to the transition from bcc+Ω-hcp to bcc+amorphous structure. For both of the dopants exemplified in Tables 1 and 2, the resistance to abrasion was greatest when the dopant was present at concentrations that resulted in a bcc+Ω-hcp structure (grey columns).

TABLE 1

| | CrN | CrMo | | $CrZr_x$ | | | |
|---|---|---|---|---|---|---|---|
| x | — | 0.06 | 0.03 | 0.05 | 0.06 | 0.11 | 0.15 |
| Atomic Percentage (%) | — | 5.8 | 2.8 | 4.4 | 5.8 | 9.8 | 12.9 |
| Crystal Structure | fcc | bcc | bcc | bcc + Ω-hcp | bcc + Ω-hcp | bcc + amorph | bcc + amorph |
| Abrasion Resistance (%) | 100.0 | 60.0 | 73.9 | 111.4 | 109.1 | 100.0 | 87.5 |
| Chroma | 4.1 | 0.21 | 0.4 | 0.1 | 0.3 | 1.0 | 1.4 |
| Reflectivity (%) | 55.5 | 50.5 | 52.7 | 52.5 | 53.8 | 56.6 | 57.5 |

TABLE 2

| | CrN | CrMo | | $CrCo_x$ | | | |
|---|---|---|---|---|---|---|---|
| x | — | 0.06 | 0.01 | 0.02 | 0.04 | 0.05 | 0.06 |
| Atomic Percentage (%) | — | 5.8 | 0.6 | 1.9 | 3.9 | 4.7 | 5.7 |
| Crystal Structure | fcc | bcc | bcc | bcc + Ω-hcp | bcc + Ω-hcp | bcc + Ω-hcp | bcc + Ω-hcp + amorph |
| Abrasion Resistance (%) | 100.0 | 60.0 | 80.2 | 113.2 | 116.0 | 129.2 | 97.2 |

TABLE 2-continued

|  | CrN | CrMo | CrCo$_x$ | | | | |
| --- | --- | --- | --- | --- | --- | --- | --- |
| Chroma | 3.6 | 0.21 | 1.0 | 0.8 | 0.4 | 0.2 | 0.0 |
| Reflectivity (%) | 56.6 | 50.5 | 50.9 | 51.6 | 54.7 | 53.9 | 57.0 |

Examples

Crystal Structure of the Coating

The co-sputtering generates thin film coatings of Cr doped with another metal (Zr in the case of most of what is described here, but alternatively also Ti or Co, or less preferably Hf, Ru, Y and Os). As mentioned above, dopant materials such as these modify the structure of the Cr based coating by replacing Cr atoms within the bcc crystal lattice. This modification of the atomic structure of the bcc Cr coating was observed and quantified for the preferred Zr dopant material by measuring the lattice parameter of the crystal structure using electron diffraction. The incorporation of dopant and the resulting change in lattice parameter was observed to correlate with the macroscopic abrasion resistance. Depending on the class of the dopant metal (be it bcc or hcp) at room temperature, it was found that the degree of modification of the bcc Cr crystal lattice could be controlled.

An understanding of the atomic structure of the preferred binary alloys formed in the reflective coatings of the present invention was developed by conducting electron diffraction experiments on samples using a Philips CM200 Transmission Electron Microscope (TEM). These samples were prepared by sputtering directly onto NaCl crystals, dissolving away the crystal in Milli-Q water, and then floating the alloy coating onto an uncoated copper TEM grid. The samples included the use of the additional hcp transition metal Ti, plus the bcc transition metals Mo and W which were investigated for comparative purposes.

The diffraction pattern from each sample was analysed in order to determine the lattice parameter, $a_0$, in the case of crystalline coatings or simply to confirm an amorphous structure when no crystalline material is observed. The experimental window for the dopant target power was chosen based on the overall maximum Bayer Ratio achieved for each dopant material. This window was in the range of 50 to 100 W. The resulting powers tested for the different alloy mixtures were Mo and W=100 W; and Co, Ti and Zr=50 W.

Figure 5:
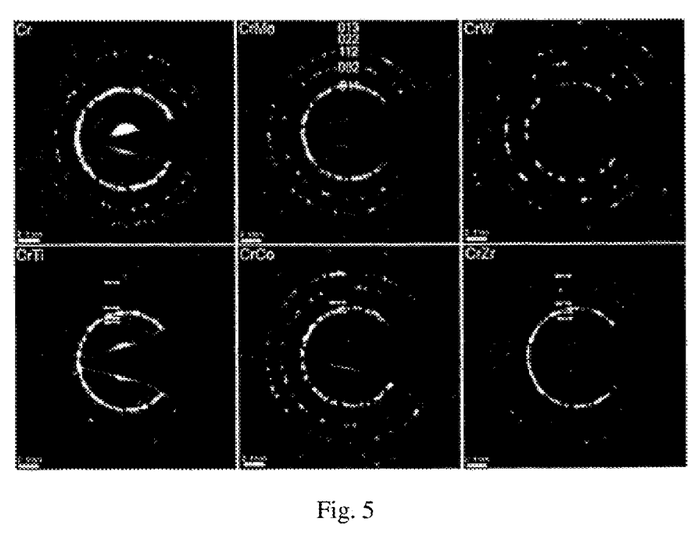
FIG. 5 shows diffraction patterns from a Transmission Electron Microscope for $CrM_x$ samples in accordance with embodiments of the present invention (M=Zr, Co and Ti) and for comparative purposes (M=W and Mo)

The dominant phase present for the solid solutions of these samples was found to be the bcc structure, however for certain samples additional phases were observed. The diffraction spectra of CrCo$_x$, CrZr$_x$ and CrTi$_x$ showed the presence of a secondary phase different from bcc as indicated by the arrows in FIG. 5. This secondary phase was identified as a Ω-hcp phase, a displacive phase transformation from the bcc phase. Further to this analysis, it was noted that amorphous material is present in the background of the diffraction patterns, with this phase being most noticeable for the CrTi$_x$ alloy (the blurred background in the CrTi$_x$ diffraction image in FIG. 5).

Figure 6:
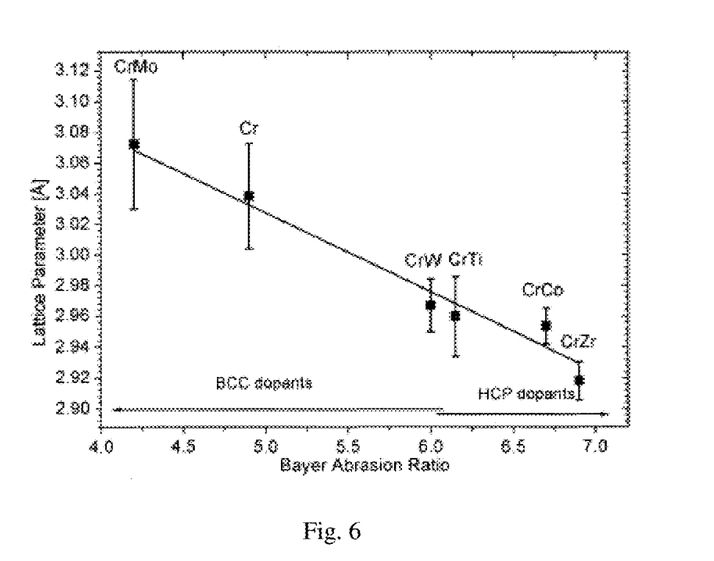
FIG. 6 shows the relationship between lattice parameter and abrasion resistance across the chromium based samples prepared for the examples.

The relationship between the atomic structure and the macroscopic abrasion resistance is evident in Tables 1, 2. Additionally, and as can be seen in FIG. 6, across the Cr based alloys of the samples, there is a clear trend that as the lattice parameter decreases the abrasion resistance increases. This increase in abrasion resistance is primarily attributed to the increase in packing density of the atoms.

Indeed, comparing the atomic radii of the dopant materials to that of Cr highlights that the change in lattice parameter of the CrM$_x$ alloys cannot be rationalised based on size constraints on the packing density (for example, W has a larger atomic radius yet a decrease in lattice parameter was observed for an alloy with W as the dopant material). Indeed, for transition metal alloys the electronic state of the atoms being alloyed and their electronic interaction generally play a contributing role in defining the lattice parameter. A comparison of the valence electrons for Cr ($4s^1$ and $3d^5$) with the preferred dopant materials of the present invention shows that Mo is comparable ($5s^1$ and $4d^5$), while the others have additional s-orbital and differing number of d-orbital valence electrons. The dopant materials with a differing number of valence electrons compared to Cr yielded a decrease in the lattice parameter in the alloy, while Mo (which is not one of the preferred hcp transition metals ideal for use as the dopant material) yielded an increase.

With respect to the mechanical properties of the preferred alloys of the present invention, these results contrast to other situations where the addition of dopant material with a greater number of valence electrons yields solid solution softening when alloyed with the group-VI metals of Mo and W.

While not wishing to be bound by theory, it is believed that the orbital overlap for the dopant materials with additional valence electrons increases the bonding strength in the alloy, thus yielding a reduced lattice parameter. Importantly, the bcc structure of the as-deposited Cr has been modified to a level by the dopant material where the abrasion resistance rivals that of an as-deposited bcc CrN coating (Bayer Abrasion Ratio ~7 for an as-deposited CrN$_{1.3}$ coating using the custom-built reactor on the specially prepared substrates).

Finally, the preferred dopant materials utilised in this experimental work are also able to be categorised by their room temperature equilibrium structures. Mo and W are bcc at room temperature, while Ti, Co and Zr are hcp at room temperature. The hcp dopant materials achieve a greater reduction in lattice parameter than the bcc dopant materials. Given the observation of the electron structure of the dopant material influencing the bonding strength, it is believed that the hcp dopant material's electronic structure yields higher bond strengths. In addition, and as mentioned above, these hcp dopant materials yield the preferred composite film having both the bcc and the Ω-hcp phase.

It will be appreciated that there may be other variations and modifications to the compositions described herein that are also within the scope of the present invention.

The invention claimed is:

1. A rear view device for a vehicle, the rear view device comprising:
   a polymeric housing having disposed therein a side turn indicator, the side turn indicator comprising at least one light element, and
   a polymeric substrate, wherein the polymeric substrate is coated with a chromium-based reflective coating and wherein the polymeric substrate and the chromium-based reflective coating are at least in part permeable to light originating from the at least one light element, wherein the coating is an alloy of chromium and a dopant material, the dopant material being selected from the hexagonally close-packed transition metals, the alloy having a crystal structure of a primary body-centered cubic phase in coexistence with a secondary omega hexagonally close-packed phase.

2. The rear view device according to claim 1, wherein the at least one light element is arranged on one side of the polymeric substrate.

3. The rear view device according to claim 1, wherein the side turn indicator is incorporated into the polymeric housing by over-moulding the side turn indicator with the polymeric material of the housing.

4. The rear view device according to claim 1, wherein the side turn indicator is incorporated into an opening in the surface of the polymeric housing having a closeable lid made of the polymeric substrate coated with a chromium-based reflective coating such that the polymeric substrate and the chromium-based reflective coating are at least in part permeable to light originating from the at least one light element, and wherein the coating is an alloy of chromium and a dopant material, the dopant material being selected from the hexagonally close-packed transition metals, whereby the alloy has a crystal structure of a primary body-centered cubic phase in coexistence with a secondary omega hexagonally close-packed phase.

5. The rear view device according to claim 1, wherein the side turn indicator comprises a polymeric light pipe.

6. The rear view device according to claim 5, wherein the polymeric light pipe comprises at least one LED lamp to illuminate the light pipe.

7. The rear view device according to claim 6, wherein the polymeric light pipe is adapted to sequentially radiate the light from the at least one LED lamp.

8. The rear view device according to claim 1, comprising at least one side turn indicator comprising a plurality of LED lamps and a light reflector arrangement, wherein the plurality of LED lamps are adapted to sequentially illuminate the light reflector element, wherein the light originating from the at least one side turn indicator sweeps from a center outwards to promote direction of travel, wherein the light has the appearance of a continuous even illumination.

9. The rear view device according to claim 1, comprising at least one side turn indicator comprising a plurality of LED lamps and a light diffusing element, wherein the plurality of LED lamps are adapted to sequentially illuminate the light diffusing element, wherein the light originating from the at least one side turn indicator sweeps from a center outwards to promote direction of travel, wherein the light has the appearance of a continuous even illumination.

10. The rear view device according to claim 1, wherein the alloy is a binary alloy of chromium and the dopant material.

11. The rear view device according to claim 10, wherein the atomic percentage of the dopant material in the binary alloy is in the range of from about 1.9 at. % to about 5.8 at. %.

12. The rear view device according to claim 1, wherein the dopant material is selected from the hexagonally close-packed transition metals zirconium, titanium, cobalt, hafnium, rubidium, yttrium and osmium.

13. The rear view device according to claim 1, wherein the dopant material is selected from the hexagonally close-packed transition metals zirconium, titanium and cobalt.

14. The rear view device according to claim 1, wherein the alloy is a binary alloy and the dopant material is zirconium, and wherein the atomic percentage of the zirconium in the binary alloy is in the range of from about 4.5 at. % to about 5.8 at. %.

15. The rear view device according to claim 1, wherein the alloy is a binary alloy and the dopant material is titanium, and wherein the atomic percentage of the titanium in the binary alloy is in the range of from about 1.9 at. % to about 5.8 at. %.

16. The rear view device according to claim 1, wherein the alloy is a binary alloy and the dopant material is cobalt, and wherein the atomic percentage of the cobalt in the binary alloy is in the range of from about 1.9 at. % to 5.7 at. %.

17. The rear view device according to claim 1, wherein the chromium-based reflective coating has a thickness of 200 nm or less.

18. The rear view device according to claim 17, wherein the thickness of the chromium-based reflective coating is 100 nm or less.

19. The rear view device according to claim 18, wherein the thickness of the chromium-based reflective coating is in the range of from 40 nm to 80 nm.

20. The rear view device according to claim 19, wherein the thickness of the chromium-based reflective coating is in the range of from 50 nm to 70 nm.

21. The rear view device according to claim 20, wherein the thickness of the chromium-based reflective coating is about 60 nm.

22. The rear view device according to claim 1, wherein the polymeric substrate is formed from a material selected from the group of polyacrylate, polyester, polystyrene, polyethylene, polypropylene, polyamides, polyamides, polycarbonate, epoxy, phenolic, acrylonitrile-butadiene-styrene, acrylonitrile-styrene-arylates, acetal and blends of these.

23. The rear view device according to claim 1, wherein the polymeric substrate is formed from a material selected from the group of polycarbonate, poly (2,2'-dihydroxyphenylpropane) carbonate, polydiethyleneglycol bis(allyl carbonate), polymethylmethacrylate, polystyrene, or blends thereof.

24. The rear view device according to claim 1, wherein the polymeric substrate includes a pre-coated film in the form of either a hardcoat, an inorganic oxide, or a thin metal film, or a combination of such pre-coated films.

25. The rear view device of claim 1, wherein the rear view device comprises a surface having a metallic appearance that is realized by the coated polymeric substrate.

26. The rear view device of claim 25, wherein a side turn indicator is arranged below the surface having a metallic appearance or comprises at least part of said surface having the metallic appearance.

27. The rear view device of claim 26, wherein light originating from a light source of the side turn indicator shines through the surface of the polymeric substrate having a metallic appearance.

28. The rear view device of claim 27, wherein light originating from the light source of the side turn indicator sweeps in one direction to indicate a direction of travel.

29. The rear view device of claim 28, wherein a light front is moving in said direction of travel.

30. The rear view device according to claim 1, wherein the side turn indicator comprises a polymeric light pipe comprising a clear polymeric material.

31. The rear view device according to claim 1, wherein the polymeric housing defines in its surface an opening and a closable lid for said opening, wherein the closeable lid comprises the polymeric substrate coated with the chromium-based reflective coating, and wherein the side turn indicator is incorporated into the opening beneath the closeable lid so that light originating from the side turn indicator can shine through the lid.

* * * * *